United States Patent
Butler et al.

(10) Patent No.: US 7,113,256 B2
(45) Date of Patent: Sep. 26, 2006

(54) LITHOGRAPHIC APPARATUS AND DEVICE MANUFACTURING METHOD WITH FEED-FORWARD FOCUS CONTROL

(75) Inventors: Hans Butler, Best (NL); Marcus Emile Joannes Boonman, Veldhoven (NL); Petrus Marinus Christianus Maria Van Den Biggelaar, Nuenen (NL)

(73) Assignee: ASML Netherlands B.V., Veldhoven (NL)

( * ) Notice: Subject to any disclaimer, the term of this patent is extended or adjusted under 35 U.S.C. 154(b) by 92 days.

(21) Appl. No.: 10/779,866

(22) Filed: Feb. 18, 2004

(65) Prior Publication Data

US 2005/0179880 A1    Aug. 18, 2005

(51) Int. Cl.
*G03B 27/42* (2006.01)
(52) U.S. Cl. .................... 355/53; 355/72; 355/75; 318/640; 318/649; 250/492.2; 250/548; 430/30
(58) Field of Classification Search ............. None
See application file for complete search history.

(56) References Cited

U.S. PATENT DOCUMENTS

| | | | |
|---|---|---|---|
| 5,118,957 A * | 6/1992 | Kawashima et al. ..... 250/559.4 |
| 5,229,872 A | 7/1993 | Mumola |
| 5,296,891 A | 3/1994 | Vogt et al. |
| 5,502,311 A * | 3/1996 | Imai et al. .................. 250/548 |
| 5,523,193 A | 6/1996 | Nelson |
| 5,602,400 A * | 2/1997 | Kawashima ................ 250/548 |
| 5,777,721 A * | 7/1998 | Makinouchi ................. 355/53 |
| 5,969,441 A * | 10/1999 | Loopstra et al. ............... 310/12 |
| 6,046,792 A | 4/2000 | Van Der Werf et al. |
| 6,081,614 A * | 6/2000 | Yamada et al. ............. 382/151 |
| 6,118,515 A * | 9/2000 | Wakamoto et al. ........... 355/53 |
| 6,260,282 B1 | 7/2001 | Yuan et al. |
| 6,400,456 B1 * | 6/2002 | Miyachi ..................... 356/399 |
| 6,618,120 B1 * | 9/2003 | Ueta ........................... 355/72 |
| 2001/0002303 A1 | 5/2001 | Yuan |
| 2002/0039694 A1 * | 4/2002 | Scheiberlich et al. ......... 430/30 |
| 2002/0171815 A1 * | 11/2002 | Matsuyama et al. .......... 355/55 |

FOREIGN PATENT DOCUMENTS

EP        1 231 513 A1    8/2002
WO       WO 98/40791      9/1998

* cited by examiner

*Primary Examiner*—D. Rutledge
(74) *Attorney, Agent, or Firm*—Pillsbury Winthrop Shaw Pittman, LLP

(57) ABSTRACT

A lithographic apparatus includes an illumination system configured to provide a beam of radiation, a first support structure configured to support a patterning device, a second support that includes a substrate holder for holding a substrate, a projection system configured to project the patterned beam of radiation onto the substrate, and a servo unit configured to position the substrate holder. The apparatus further includes a sensor unit configured to determine a distance of at least one location point on the surface of the substrate relative to a reference plane, a memory unit configured to store surface information of the substrate based on respective distances of corresponding location points on the substrate surface, and a calculating unit configured to determine a feed-forward set-point signal based on the stored surface information, such that the feed-forward set-point signal is forwardly fed to the servo unit in order to position the substrate holder.

19 Claims, 4 Drawing Sheets

LITHOGRAPHIC APPARATUS AND DEVICE MANUFACTURING METHOD WITH FEED-FORWARD FOCUS CONTROL

BACKGROUND OF THE INVENTION

1. Field of the Invention

The present invention relates to lithographic apparatus with improved focus control.

2. Description of the Related Art

Lithographic apparatus can be used, for example, in the manufacture of integrated circuits (ICs). In such a case, a patterning device may be used to generate a desired circuit pattern corresponding to an individual layer of the IC, and this pattern can be imaged onto a target portion (e.g. comprising one or more dies) on a substrate (silicon wafer) that has been coated with a layer of radiation-sensitive material (resist).

Generally, such apparatus include an illumination system for supplying a beam of radiation, a support for supporting the patterning device, a substrate holder for holding a substrate, and a projection system for projecting the patterned beam onto a target portion of the substrate. More information with regard to lithographic devices as here described can be gleaned, for example, from U.S. Pat. No. 6,046,792, incorporated herein by reference.

The term "patterning device" as employed herein should be broadly interpreted as referring to a mechanism that can be used to endow an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such a patterning device include:

mask: the concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support will generally be a mask table, which ensures that the mask can be held at a desired position in the incoming radiation beam, and that it can be moved relative to the beam if so desired;

programmable mirror array: an example of such a device is a matrix-addressable surface having a visco-elastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronics. More information on such mirror arrays can be gleaned, for example, from U.S. Pat. Nos. 5,296,891 and 5,523,193, which are incorporated herein by reference. In the case of a programmable mirror array, the said support structure may be embodied as a frame or table, for example, which may be fixed or movable as required; and programmable LCD array: an example of such a construction is given in U.S. Pat. No. 5,229,872, which is incorporated herein by reference. As above, the support in this case may be embodied as a frame or table, for example, which may be fixed or movable as required.

For purposes of simplicity, the rest of this text may, at certain location point points, specifically direct itself to examples involving a mask and mask table; however, the general principles discussed in such instances should be seen in the broader context of the patterning device as set forth above.

In general, a single wafer will contain a whole network of adjacent target portions that are successively irradiated via the projection system, one at a time. In current apparatus, employing patterning by a mask on a mask table, a distinction can be made between two different types of machine. In one type of lithographic apparatus—commonly referred to as a wafer stepper—each target portion is irradiated by exposing the entire mask pattern onto the target portion in one go. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction. Because, typically, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic apparatus, the pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer.

If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the beam of radiation, and such components may also be referred to below, collectively or singularly, as a "lens".

Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. Nos. 5,969,441 and 6,262,796, incorporated herein by reference.

Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. Nos. 5,969,441 and 6,262,796, both incorporated herein by reference.

Conventionally, lithographic apparatus employ controllers to position the surface of the substrate in the focal plane of the projection system. The controller utilizes feedback servo information to position the substrate table. In so doing, the controller only starts acting when first a servo error is created. Such a configuration results in limited performance and a non-optimal focusing.

SUMMARY OF THE INVENTION

The principles of the present invention, as embodied and broadly described herein, provide for a lithographic apparatus to provide a lithographic apparatus with an improved focus control system such that substrates of a high quality can be manufactured. In one embodiment, the lithographic apparatus comprises an illumination system configured to provide a beam of radiation, a first support configured to support a patterning device that imparts the beam of radiation with a desired pattern in its cross-section, a second support that includes a substrate holder for holding a substrate, a projection system configured to project the patterned beam of radiation onto a target portion on a surface of the substrate, and a servo unit configured to position the substrate holder. The apparatus further includes a sensor unit configured to determine a distance of at least one location point on the surface of the substrate relative to a reference plane, a memory unit configured to store surface information of the substrate based on respective distances of corresponding location points on the substrate surface, and a calculating unit configured to determine a feed-forward set-point signal based on the stored surface information, such that the feed-forward set-point signal is forwardly fed to the servo unit in order to position the substrate holder.

An attribute of the invention resides in the insight that there is room for improvement in the control of the servo unit. Another attribute of the invention resides in finding out how this improvement can be realized. Finally, these attributes are reached by the lithographic apparatus in accordance with the invention that is provided with a memory unit for storing surface information of the substrate comprising respective distances of respective location point points on the surface with respect to the reference plane and a calculating unit for calculating a feed-forward set-point signal for the servo unit on the basis of the stored surface information of the substrate.

Since the servo-unit receives a feed-forward set-point signal, positioning of the table can be performed in a very accurate and fast (pre-determined) way such that, opposite to a situation wherein the servo is only controlled by a feed-back set-point signal, the position of the table is corrected before a significant position error from a desired position of the table will occur.

The sensor unit may comprise a level sensor for measuring the said surface information in the format of an array of measured distances as a function of two dimensional coordinates, wherein each two-dimensional co-ordinate is defined by an orthogonal projection of the corresponding location point on the reference plane. The surface is preferably measured while the substrate is fixed or clamped (for example by a suction damper or an electrostatic clamper) on a supporting surface of the table, since the fixing or clamping on the supporting surface may influence the surface pattern. After having obtained the surface information, the surface or the "height map" of the substrate is known.

The information can subsequently be used for fitting a mathematical smooth function to the "height map" of the substrate, wherein the calculating unit can calculate derivations of the smooth mathematical function in order to determine a very accurate feed-forward set-point signal on the basis of the smooth mathematical function and/or derivations of the mathematical function.

Preferably, the reference plane is substantially parallel oriented to the supporting surface of the substrate table, wherein the reference plane can have a fixed position with respect to the projection system. The later guarantees that the distances of the surface are determined with respect to the projection system, such that the surface information ("height map") can be related to the projection system thereby enabling a reliable focus control.

One embodiment is characterized in that the second support comprises a second substrate table, wherein the lithographic apparatus is constructed and arranged to measure with the level sensor surface information of a substrate placed on the second substrate table, while exposing another substrate placed on the said substrate table which is thereby positioned by the servo unit on the basis of surface information of the another substrate. Thus, a dual stage or twin-stage concept is efficiently used for performing the invention.

Herewith, the surface or "height map" of the substrate is determined on a first table while another substrate is exposed on a second table. So, in the meantime (or in advance) calculations are preformed to calculate in advance a feed-forward set-point signal. Next, the exposed substrate is conveyed to other parts of the lithographic apparatus and the substrate which has been measured while fixed on the first table will exposed while the focus control is performed on the basis of the already calculated feed-forward set-point signal (a feedback signal will normally also be applied for reducing inevitable position, speed, acceleration etc errors).

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc.

The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The phrase "patterning device," as used herein, should be broadly interpreted as referring to a device that can be used to impart a beam of radiation with a pattern in its cross-section such as to create a pattern in a target portion of the substrate. It should be noted that the pattern imparted to the beam may not exactly correspond to the desired pattern in the target portion of the substrate. Generally, the pattern imparted to the beam will correspond to a particular functional layer in a device being created in the target portion, such as an integrated circuit.

The patterning device may be transmissive or reflective. As indicated above, examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support supports, i.e. bears the weight of, the patterning device. It holds the patterning device in a way depending on the orientation of the patterning device, the design of the lithographic apparatus, and other conditions, such as for example whether or not the patterning device is held in a vacuum environment. The support can be using mechanical clamping, vacuum, or other clamping techniques, for example electrostatic clamping under vacuum conditions. The support may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device."

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

It is noted that the invention also relates to a method of using a lithographic apparatus for manufacturing for example integrated circuits.

BRIEF DESCRIPTION OF DRAWINGS

Below, the invention will be explained with reference to some drawings, which are intended for illustration purposes only and not to limit the scope of protection as defined in the accompanying claims.

DETAILED DESCRIPTION

Lithographic Apparatus

Figure 1:
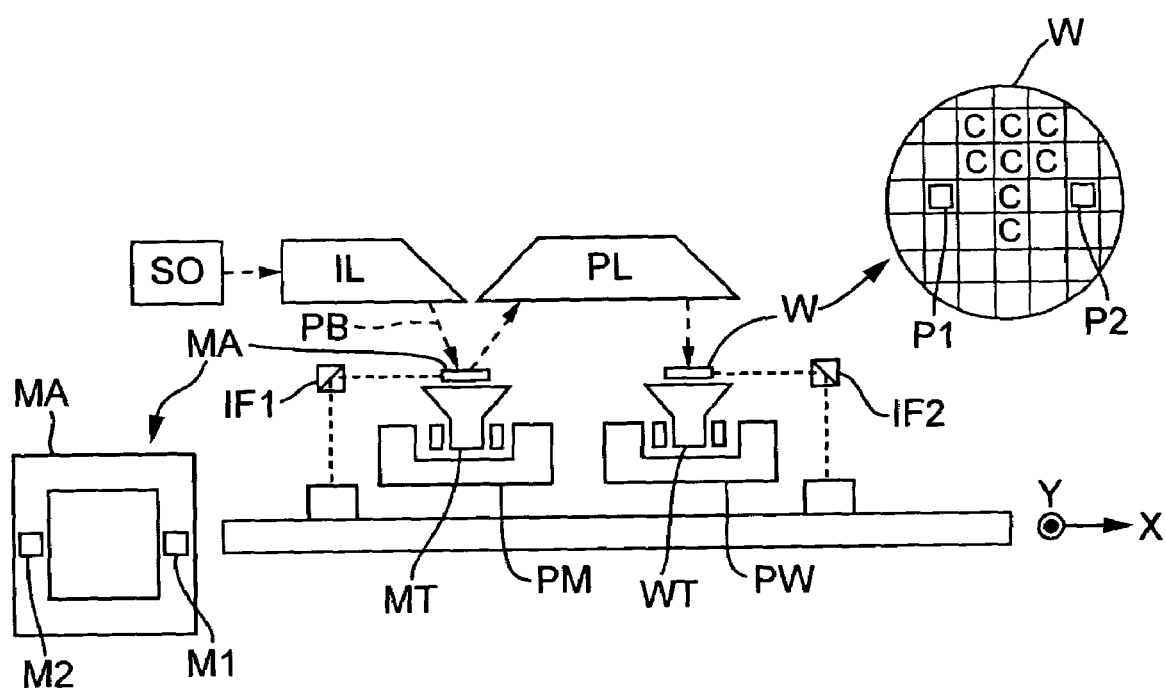
FIG. 1 depicts a lithographic apparatus according to an embodiment of the invention.

FIG. 1 schematically depicts a lithographic apparatus 1 according to a particular embodiment of the invention. The apparatus is of the type having two substrate tables and comprises:

an illumination system IL: an illumination system (illuminator) IL for providing a beam PB of radiation (e.g. UV or EUV radiation);

a first support (e.g. a mask table or holder) MT: for supporting patterning device (e.g. a mask) MA and connected to a first servo unit PM for accurately positioning the patterning device with respect to projection system PL;

a second support: comprising a substrate holder (e.g. a wafer table) WT for holding a substrate (e.g. a resist-coated wafer) W and connected to a second servo unit PW for accurately positioning the substrate with respect to projection system PL; and the projection system (e.g. a reflective projection lens) PL for imaging a pattern imparted to the beam PB by patterning device MA onto a target portion C (e.g. comprising one or more dies) of the substrate W.

As here depicted, the apparatus is of a reflective type (i.e. has a reflective mask). However, in general, it may also be of a reflective type, for example (with a transmissive mask). Alternatively, the apparatus may employ another kind of patterning device, such as a programmable mirror array of a type as referred to above.

The illuminator IL receives of radiation from a radiation source SO. The source and the lithographic apparatus may be separate entities, for example when the source is a plasma discharge source. In such cases, the source is not considered to form part of the lithographic apparatus and the radiation is generally passed from the source SO to the illuminator IL with the aid of a radiation collector comprising for example suitable collecting mirrors and/or a spectral purity filter. In other cases the source may be integral part of the apparatus, for example when the source is a mercury lamp. The source SO and the illuminator IL, may be referred to as a radiation system.

The illuminator IL may comprise an adjusting device for adjusting the angular intensity distribution of the beam. Generally, at least the outer and/or inner radial extent (commonly referred to as a-outer and a-inner, respectively) of the intensity distribution in a pupil plane of the illuminator can be adjusted. The illuminator provides a conditioned beam of radiation, PB, having a desired uniformity and intensity distribution in its cross-section.

The beam PB is incident on the mask MA, which is held on the mask table MT. Being reflected by the mask MA, the beam PB passes through the lens PL, which focuses the beam onto a target portion C of the substrate W. With the aid of the second servo unit PW and position sensor IF2 (e.g. an interferometric device), the substrate table WT can be moved accurately, e.g. so as to position different target portions C in the path of the beam PB. Similarly, the first servo unit PM and position sensor IF1 can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the first servo unit PM and the servo unit PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

step mode: the mask table MT and the substrate table WT are kept essentially stationary, while an entire pattern imparted to the beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

scan mode: the mask table MT and the substrate table WT are scanned synchronously while a pattern imparted to the beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

other mode: the mask table MT is kept essentially stationary holding a programmable patterning device, and the substrate table WT is moved or scanned while a pattern imparted to the beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Embodiments

The single-stage substrate stepper, discussed directly hereinafter, has a servo unit that operates only on the basis of a feedback set-point signal, herewith the leveling takes place "on-the-fly". During exposure of the substrate, the substrate height (distance of the surface of the substrate with respect to a reference frame REF) is determined on one location point and fed back to the servo unit. For this determination a measurement is performed by a level sensor LS yielding the distance of the substrate (wafer) surface with respect to a fixed point on the substrate table WT.

Figure 2:
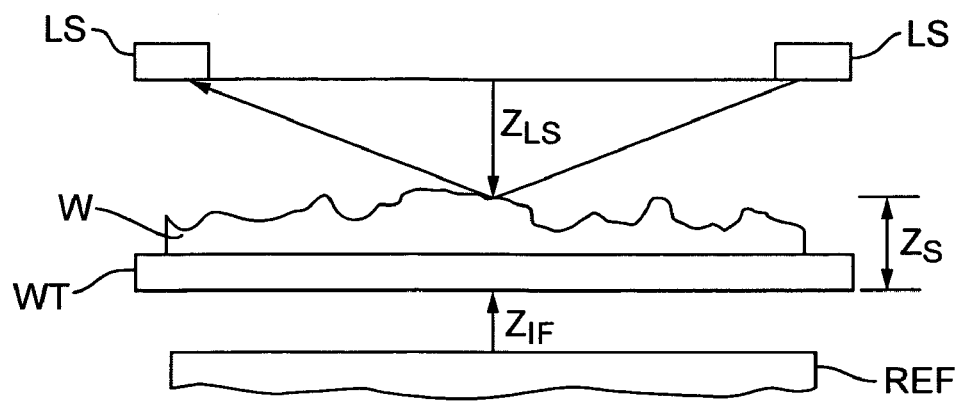
FIG. 2 a schematic one dimensional representation of a surface of a substrate.

For example, as shown in FIG. 2, the combined height of the substrate (also called wafer) W and the substrate table WT (on which the substrate W is fixed) is defined as $Z_S$. Now, if the position of the substrate table WT is measured by an interferometer IF with respect to the reference frame REF as shown in FIG. 2 and indicated by $Z_{IF}$, the relation $Z_S = Z_{LS} - Z_{IF}$ holds, and the orientation of the surface with respect to the reference frame REF is known. Note that in practice, mostly, not only the distance or height ($Z_{LS}$) but also the tilts (Rx and Ry) are measured. In this disclosure, distance or surface information can, depending on the context, also comprise tilt.

Note that in general the level sensor LS does not create a signal that is optimal from a focusing standpoint. As an example of this, the area on the wafer that the level sensor measures could deviate from the exposure slit. The real optimal stage position that creates optimal focusing could only be determined by a fine enough measurement grid in the exposure slit, which is generally not present in these on-the-fly leveling systems. This is one of the reasons that the stage does not directly use the level sensor output as its input. As discussed, first the substrate height is calculated as shown in FIG. 2.

Figure 3:
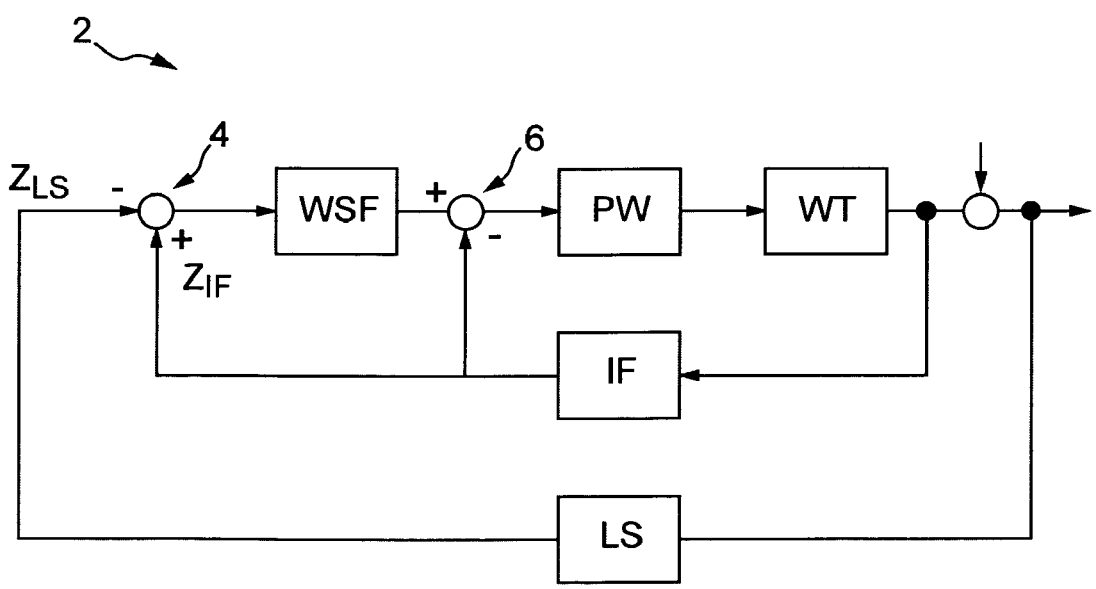
FIG. 3 a conventional focus control of a lithographic apparatus.

FIG. 3 presents a schematic overview of the table controller 2 (also called stage controller). The controller can comprise a Level Sensor LS which outputs a signal containing a measured distance $Z_{LS}$ (also tilt measurements can be included in the signal) of a location point on the surface of the substrate W with respect to the object table (substrate table) WT. The signal outputted by the Level Sensor LS is fed to combiner 4 and subtracted from the measurement signal $Z_{IF}$, which measurement signal indicates the position of the substrate table WT with respect to the reference frame REF.

Next the difference signal is processed by a wafer shape filter WSF which yields a pre-formed optimal setpoint. Furthermore, the wafer shape filter WSF can perform corrections for specific individual LS spatial characteristics. Thus the substrate height is filtered by a so-called 'wafer shape filter', which attempts to create an optimal leveling setpoint for the servo unit PW for positioning the wafer stage. The wafer shape filter WSF output then functions as a setpoint for the interferometer-controlled wafer stage WT, as shown in FIG. 3.

Herewith, the resulting actual position of the table WT is fed back via IF to combiner 6 as shown in FIG. 3. In this way a feedback servo setpoint configuration is used, amongst other, to position the substrate table and in particular to position the surface of the substrate in the focal plane of the projection system PL. Thus, note that the controller 2 lacks a feed-forward set-point signal for the servo unit. Hence the controller only starts acting when first a servo error is created. This is related to the fact that an on-the-fly leveling system is used. The consequence is a limited servo performance and thus a non-optimal focusing.

An embodiment of the lithographic apparatus, in accordance with the present invention, is disclosed. For this embodiment, a dual stage (dual table or Twin Scan apparatus) apparatus, is discussed in detail. Although, the invention can be applied in this Twin-Scan apparatus in an optimal way, it will be readily appreciated that the invention can be applied to single stage machines as well.

Figure 4:
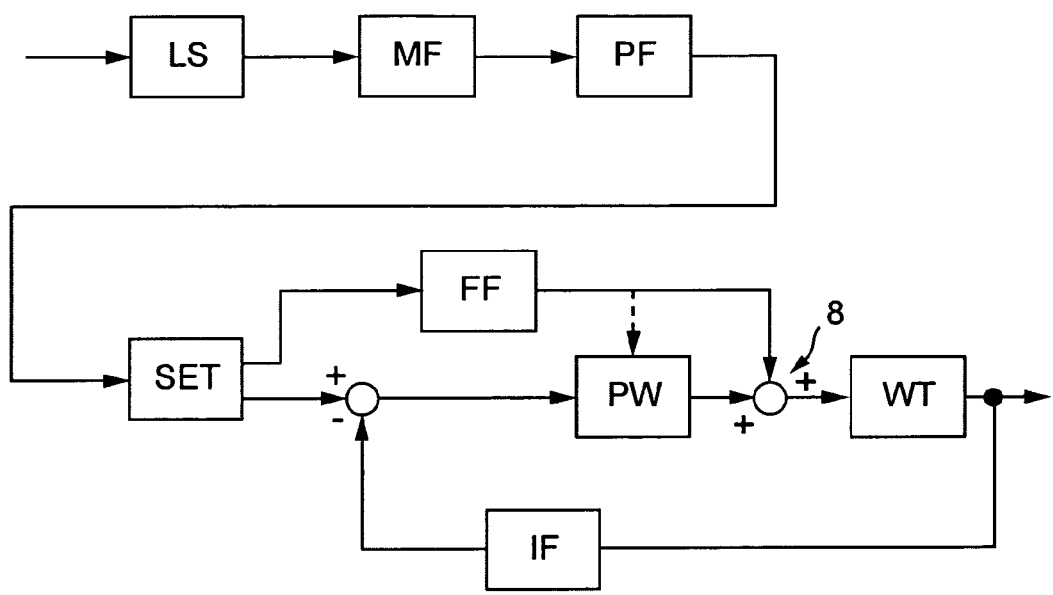
FIG. 4 a control system for focus control of a lithographic apparatus according to the invention.

In a dual-stage apparatus, first the complete wafer height map (surface information of the substrate) is measured at the measurement stage, as indicated in FIG. 4 by 'Level Sensor' LS. The measurements can be stored in a memory unit (this memory unit can be connected via electronics to the level sensor LS). The wafer height is determined, similar to that described in the previously. The used level sensor, however, utilizes a larger array of measurement location points and hence creates much finer detailed data than previously. This yields an array of measured distances as a function of two-dimensional co-ordinates in a reference plane.

Because a detailed wafer height map is now available, with a much greater resolution than in the previously described design, the real optimal stage profiles can be calculated. These profiles assure optimal wafer focusing. This calculation is indicated by the block 'Moving Focus' (see the MF-block in FIG. 4).

Further, on the optimal profiles, a series of polynomials are fitted together that describe the desired stage Z, Rx and Ry positions as a function of the stage position. The polynomials are of a relatively low order (4 or 5), but each describe only a small part of the wafer surface (approx. 4 mm). This step is indicated by 'Polynomial Fit', as depicted by the PF-block in FIG. 4, and is used to enable a smooth transition from a description in the 'place domain' (wafer surface as a function of the X, Y position on the wafer) to the 'time domain', as used by the wafer stage.

The 'Setpoint generator' SET evaluates the polynomials as a function of time and hence creates the stage position setpoints. In addition, it creates the stage acceleration setpoints as a function of time. This step requires a double differentiation of the polynomials, which is an easy symbolic manipulation. In fact, the acceleration is created by evaluating a new $2^{nd}$ or $3^{rd}$ order polynomial which is derived from the original $4^{th}$ or $5^{th}$ order polynomials. The calculating unit in this embodiment includes the blocks MF, PF, SET. The servo unit is indicated by the block PW.

While the acceleration setpoint is now available, multiplying this with the stage mass yields the required force to move the stage. Hence, applying this force to the stage makes it move according to the position setpoint. When the stage moves according to the position setpoint due to its acceleration feed-forward, the input to the stage controller is zero, and hence the control error is zero. To summarize, an exact feed-forward yields a much lower control error than in a conventional control system lacking such a feed-forward signal.

Note that the feed-forward signal can be feed-forwarded according to the given continuous line coming from the feed-forward block FF and leading to the combiner 8, such that the feed-forward signal is injected into the combiner 8 (in this case the combiner 8 is part of the servo-unit) wherein the feed-forward set-point signal is thus combined with the set-point signal resulting from the feedback control. It is noted that a better visualization is such as indicated with the dotted line, indicating that in fact the feed-forward signal is injected in the servo unit PW.

Experimental results indicate that the performance improvement achieved by applying a feed-forward set-point signal is significant with respect to conventional systems only provided with feedback set-point signal for the servo unit. The overlay error (MA error) reduces from 11 to 5 nm, and the fading error. (MSD error) reduces from 23 to 11 nm.

Hereafter a more detailed description will be given of a dual stage lithographic apparatus having both a high throughput and an excellent dynamical performance as well as imaging capabilities required by sub-100 nm lithography. One of the added values of a dual stage system is increased utilization efficiency by performing wafer measurements and other overhead in parallel with exposures thus increasing the net wafers per hour. And additionally these wafer measurements can be done more extensively and create performance advantages of a dual stage system above a single stage system through its predictive and compensation inherent capability.

In the metrology position, the wafer surface height is fully mapped using a high spatial frequency measuring level sensor allowing a complete 3-dimensional wafer map to be generated. This allows the wafer surface to be placed optimally in the focal plane of the lens, minimizing the defocus and therefore delivering optimal CD control.

To prove the leveling performance advantage of a dual stage system, several test cases with known/designed wafer topology are used. One of these cases addressed the leveling performance advantage on high topology wafers, which is presented by means of defocus and CD uniformity results. The near ideal leveling performance will be shown by comparison between experimental defocus results and theoretically best achievable defocus given the intrinsic wafer flatness and finite slit size. In contrast to on-the-fly leveling, the separate metrology position eliminates the critical timing relation between the wafer height measurement and actual exposure leveling performance, independent of the exposure scan speed.

Besides leveling performance advantages, the dual stage systems full wafer map capability allows detailed focus location point monitoring functionality covering all areas to be exposed. Measuring the wafer height prior to exposure also offers flexibility in the method of deriving the desired stage positioning for exposure and the possibility to extract detailed information for real time wafer flatness monitoring.

The dual stage system allows parallel measuring and exposing of substrates. In the measurement position, a three-dimensional map of the wafer surface is generated using a high-spatial-frequency level sensor. This wafer map has a spatial resolution of 2.8 mm×0.5 mm, which is obtained by using level sensor location point points that have a dimension of 2.8 mm×2.5 mm and over sampling in the scan direction. The high-resolution map of the wafer enables the optimization of the leveling profiles for the exposure slit size.

We define the wafer non-correctable focus errors, as the wafer surface topography that cannot be completely compensated due to the finite size of the exposure slit. For a static exposure, these non-correctable errors correspond directly to defocus errors. However, during a scanned exposure, the non-correctable errors change continuously as the slit is scanned over a particular position on the wafer. In the latter case, the average value of the non-correctable errors over the exposure time defines the average defocus that this position experiences during the exposure. We define this value that depends on the slit size and on the spatial-frequency and amplitude of the wafer topography as simulated defocus, or as the Moving Average in the z-direction (MA(z)). Changes in the topography that are larger then the slit dimensions can be leveled by adjusting the stage height and tilt angle accordingly. If the topography variation occurs over distances that are smaller than the slit dimensions, the height changes cannot be leveled effectively.

The wafer non-correctable error, Moving Average MA(z), depends on the Z(y), Rx(y) and Ry(y) set points integrated over the slit size. Calculated is a moving focus optimization depending on the exposure slit size. This is the optimal path of the finite slit size through the measured wafer surface. It results in wafer stage set points Z(y), Rx(y) and Ry(y).

The focus performance shows how well the scanners is able to position a wafer surface in a flat plane, which is coupled to the focal plane of the projection lens. This focus performance can be separated into two different contribution, a leveling contribution and a servo system contribution. The latter error is the deviation of the position of the stage compared to the requested position by the leveling system. The leveling performance includes error sources from the level sensor, the eventually needed additional filtering and the wafer non-flatness.

In a dual stage system the leveling performance is mainly determined by the leveling response. This is the mathematical transformation of the measured wafer map into exposure profiles, given a certain slit size. In a single stage system however, using on-the-fly leveling, the averaging of the wafer height within the exposure slit area, needs to be done on-the-fly, and is influenced by the lay-out and coverage of the sensor location point points in the exposure slit area and the additional filtering applied to the individual location point signals to convert the measured heights into slit averaged height and tilt information.

In a dual stage system in a production situation, during exposure of the wafer, the position of a wafer is determined by means of a wafer map measured prior to exposure. This is a map measured on the measure position giving the wafer height as a function of x and y with respect to a reference plane defined by fiducial heights. It is this height map of the wafer surface that is used to position the wafer surface in the focal plane during exposure.

The dual stage system uses a nine location points level sensor array. Each location point of the array can measure the wafer surface height over an area of 2.8×2.5 mm2. By using overlapping measurements in the scanning direction spatial resolution is increased to 2.8×0.5 mm2. This means that the level sensor location point points are not filtering the height information to calculate exposure slit size optimized leveling profiles. A complete wafer height map is determined by scanning the complete 300 mm wafer underneath the sensor in a pattern corresponding to the exposure fields. FIG. 2.3 gives an example of a measured wafer map of a checkerboard wafer which is a wafer with etched fields of about 300nm deep.

This section will demonstrate the focus performance of a dual stage system in two different cases. First it will be shown how it will handle inter-field height variations and secondly how closely it matches theoretical leveling responses upon dealing with intra-field height variation, intrinsic wafer non-flatness.

With respect to the servo performance of the wafer stage the utilized performance indicators are the moving average (MA) and moving standard deviation (MSD) of the wafer stage positioning error, the so called servo errors. The Moving Average error (MA) is the average of all position errors currently in the slit at a certain position. The Moving Standard deviation error (MSD) is the standard deviation of all position errors currently in the slit at a certain position. MA is strongly related to focus (vertical axes) while MSD is more related to fading.

Figure 5:
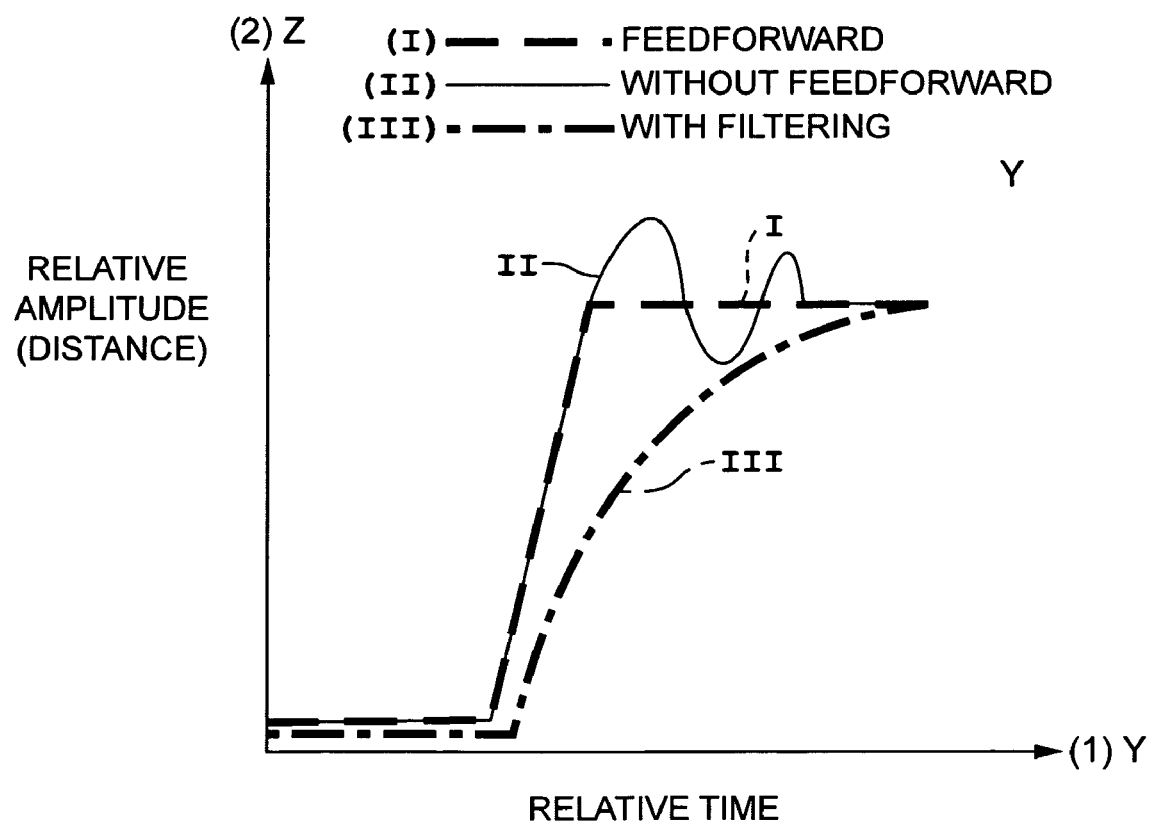
FIG. 5 is a schematic overview of different servo response profiles.

In a dual stage system all exposure profiles can be determined prior to the actual exposure, the stage performance can be optimized for stage dynamics. Given a certain exposure profile, the forces to be applied to the stage can be pre-determined, as shown in FIG. 5 (Feed Forward). Given the stage mass this allows a balanced movement of the stage (see Feed-forward curve (I) indicated as follows "---" in FIG. 5). Instead of having to apply instantaneous forces on the stage to correct it's position, which can cause unwanted overshoots of the desired movements, as indicated in FIG. 5 for a system without feed forwards (see Without-Feed-forward curve (II) indicated as follows "___" in FIG. 5), this can be avoided with Feed-forward technology applied in a dual stage system.

When single stage technology is employed, mostly only a closed loop feedback control is used and the upcoming profiles as well as the forces to be applied to the stage cannot be predicted. Extra filtering in the closed loop feedback can then be applied as shown in FIG. 5 in an attempt to correct for this (see With-Filtering curve (III) indicated as "-.-" in FIG. 5), and when the system is enabled to measure in front of the exposure slit, looking ahead, this information can be used to improve this result a bit, without coming close to the result obtained with Feed-forward technology.

Therefore in a dual stage concept with feed-forward focus control of the servo system the concept only has to cope with random and unpredictable disturbances on the system, excluding the wafer topography.

Favorable results were reached in practice with for example substrates (wafers) with increasing topography, ranging from bare Si wafers to back end processed wafers. These results show a very clear advantage of the feed forward possibility a dual stage system offers, which is particularly evident for substrates (wafers) with high topography. MA Z servo scan performance results for various wafers with increasing topography and MSD Z servo performance results of the same wafer set were obtained with experiments in practice.

Pre-mapping the wafer height prior to exposure not only has a throughput advantage but also a leveling performance advantage. The first arises from the fact that any possible routing constraints due to not being able to make exposure scans scanning on the wafer (outside inwards) in single stage systems, are unnecessary in dual stage systems. This means that a simple meander movement over the wafer to expose it is sufficient.

Like the inner field leveling performance, dual stage systems according to the invention always outperform conventional single stage systems, although the addition to the theoretical best achievable defocus can be somewhat larger on edge fields compared to inner fields. The somewhat larger defocus on edge fields is caused by non-identical measurement grids of the different experiments.

Overall edge defocus results in tests clearly show that a dual stage system always outperforms a single stage system, proving the excellent leveling capability of the dual stage also for edge fields.

In contrast to single stage technology, dual stage technology uses two different chucks (stages, tables). During the setup of the dual stage system, the two chucks are calibrated with respect to each other. The qualification of the focus performance of the two chucks is done using the LQT exposure, exposing the same wafer once on chuck 1 and directly after that (without reworking the wafer) on chuck 2 (with the focus sensitive marks shifted).

The defocus data on this wafer are sorted for defocus corresponding to the wafer on chuck 1 and for the wafer on chuck 2.

These two defocus maps are then analyzed in terms of average difference, global tilt difference and distribution widths. Difference between the between the two defocus distributions are detected, resulting in an indication of a global chuck to chuck focus difference. For the same set of systems the difference between the global focus tilts of the two defocus maps can be derived.

Dual stage systems at the measurement position measure every wafer with the level sensor prior to exposure. In single stage systems using on-the-fly leveling technology, this height information is gathered during the actual exposure. In contrast to most single stage systems, where one is using either large sensor location point points to measure an exposure area with high coverage, or a selection of smaller location point points which only partially cover the area to be exposed, a dual stage systems level sensor measurement determines the so-called wafer map and nearly 100% covers the whole substrate surface.

Focus Location point Monitoring enables a dual stage system to have inline metrology options based on the wafer map measurement. One example of this is the focus location point monitoring option of Twinscan, which enables to detect focus location point points even before a wafer is exposed. The focus location point detection is based on the raw data of the wafer map. In order to remove a global shape of the wafer, a 2nd order plane is subtracted from the raw data.

Obviously, the topography of the device should not be wrongly detected as a focus location point. For this reason, the software algorithm calculates the average topography of the exposure field and subtract it from the previous wafer map. What is left is in fact the wafer map of the bare silicon substrate only. Another step in the wafer map data manipulation, is an X and Y filtering by use of a moving average principle. The user can define the dimensions of the rectangle used. This step will generate a smoothed wafer map. Finally, by subtracting the "substrate only" and the "smoothed" wafer maps, a map of residuals is generated.

Note that focus location point detection on a dual stage system has a much higher sensitivity for focus location point points than a single stage system due to the much better substrate measurement coverage and resolution.

As described before, the high density level sensor measurements allow much more analysis based on the wafer map. Since the full wafer coverage height information is measured for every exposed wafer, this allows to qualify or monitor wafer flatness in terms of wafer non correctable errors, MA(z). And the actual focus performance of a dual stage system is correlating with the MA(z) calculation. So besides using a dual stage system as a real time flatness monitor, applications towards focus predictions can be made. This then means that inline defocus predictions can be made.

Having measured the high density wafer map also allows to determine the average intra-die topography, as was already described. Knowing an average field topography allows for intra-field focus optimization by means of applying focus offsets to the exposure field. Future applications are even targeting to be able to apply intra-field focus offsets to compensate for possible height measurement offsets. These offsets can then be derived from other measurements, e.g. additional sensors, external metrology measurements, focus calibration methods, etc.

Upon entering immersion lithography technology the big advantage of dual stage technology is the possibility to perform all metrology measurements in an air environment.

Besides a very clear engineering advantage, not having to measure the wafer height through a water film, several performance advantages can be seen. One of the advantages is related to the level sensor accuracy. When using an optical broadband level sensor with a large angle of incidence, in case of known dual stage systems for example 70 degrees degrees, the sensor will measure height offsets depending on the underlying substrate material properties.

Assuming a typical resist thickness of 300 nm to be employed in immersion lithography two process dependent error sources can be identified: metal density variation (variation along the vertical axis in both figures) and oxide thickness variation.

When in an air environment the metal density varies underneath the 300 nm thick resist layer, the measurement offset or PHD is larger in a water environment than in an air environment. An even larger advantage of the air environment is the much smaller measurement offset when the underlying oxide thickness varies with about 300 nm.

This means that a measurement with an optical sensor through a water film on top of a substrate surface enhances all measurement offsets currently being known. This is a major advantage of the dual stage technology, being able to use the known measurement offsets from the current lithographic processes.

Experimental data showed the leveling and imaging capability with respect to inter-field topography handling. In the case of intra-field topography the dual stage system according to the invention outperformed conventional single stage systems in all cases due to the higher density and better quality height measurements. Knowing the height map and thus the exposure profiles before moving the stage, allows to use feed forward servo controls in a dual stage system.

This shows to be a solution relatively independent of exposure scan speed, and performs much better than a straightforward single stage system using feedback servo technology. Also edge fields are much better leveled. The leveling performance on edge fields nearly matching the performance on inner fields, is also reflected in the CDU data shown, where the performance on inner and edge fields is not significantly different. Using two chucks in the same machine, the focus performance on both chucks can be matched and is identical towards the user, not having to distinguish between chucks.

Full surface coverage, high density wafer mapping prior to exposure allows much more metrology analysis. Two options are shown, where focus location point detection has been proven very successful and wafer or field topography characterization or monitoring is an option. Finally the appearance of immersion lithography brings another clear advantage of dual stage technology, being able to perform metrology measurements, especially height measurements, in a dry environment. This helps avoiding process height offset recalibrations and enlarged height measurement offsets.

Whilst specific embodiments of the invention have been described above, it will be appreciated that the invention may be practiced otherwise than as described. As such, the description is not intended to limit the invention. The configuration, operation, and behavior of the present invention has been described with the understanding that modifications and variations of the embodiments are possible, given the level of detail present herein. Thus, the preceding detailed description is not meant or intended to, in any way, limit the invention—rather the scope of the invention is defined by the appended claims.

What is claimed is:

1. A lithographic apparatus, comprising:
   an illumination system configured to provide a beam of radiation;
   a first support configured to support a patterning device that imparts said beam of radiation with a desired pattern in its cross-section;
   a second support that includes a substrate holder for holding a substrate;
   a projection system configured to project said patterned beam of radiation onto a target portion on a surface of said substrate;
   a servo unit configured to position said substrate holder;
   a sensor unit configured to determine a distance of at least one location point on the surface of said substrate relative to a reference plane;
   a memory unit configured to store surface information of said substrate based on respective distances of corresponding location points on said substrate surface; and
   a calculating unit configured to determine a feed-forward set-point signal based on said stored surface information,
   wherein said feed-forward set-point signal is forwardly fed to said servo unit in order to position said substrate holder.

2. The lithographic apparatus of claim 1, wherein said sensor unit includes a level sensor for measuring said surface information of said substrate.

3. The lithographic apparatus of claim 1, wherein said stored surface information of said substrate is formatted as an array of measured distances as a function of two dimensional coordinates, wherein each of said two-dimensional co-ordinates is defined by an orthogonal projection of said corresponding location point on the reference plane.

4. The lithographic apparatus of claim 1, wherein said substrate holder is provided with a substantially flat supporting surface for supporting said substrate and wherein the reference plane is substantially parallel oriented to the supporting surface.

5. The lithographic apparatus of claim 1, wherein the reference plane has a fixed position with respect to said projection system such that the distances of said substrate surface are determined with respect to the projection system.

6. The lithographic apparatus of claim 1, wherein said calculating unit is configured to fit a mathematical smooth function to said substrate surface based on said surface information and to calculate said feed-forward set-point signal based on said fitted function.

7. The lithographic apparatus of claim 6, wherein said mathematical function comprises at least one polynomial function that is fit locally to said substrate surface.

8. The lithographic apparatus of claim 6, wherein said calculating unit is configured to calculate derivatives of said mathematical smooth function for calculating and incorporating at least one of a speed signal and force signal in said feed-forward set-point signal.

9. The lithographic apparatus of claim 1, wherein said second support comprises a second substrate holder for holding a second substrate, and wherein surface information of said second substrate is determined while projecting said patterned beam of radiation onto said target portion of said substrate surface placed on said substrate holder arranged to be positioned by said servo unit based on previously determined surface information of said substrate.

10. A device manufacturing method, comprising:
    providing a substrate on a supporting surface of a substrate holder;
    projecting a patterned beam of radiation onto a surface of said substrate via a projection system;
    determining a distance of at least one location point on said substrate surface relative to a reference plane, said reference plane being in a fixed position relative to said projection system;
    storing surface information of said substrate based on respective distances of corresponding location points on said substrate surface;
    calculating a set-point signal based on said stored surface information;
    forwarding said set-point signal to a servo unit configured to position said substrate holder; and
    positioning said substrate holder relative to said projection system based on said forwarded set-point signal.

11. A lithographic substrate focus control system, comprising:
    a substrate support having a substrate holder configured to hold a substrate;
    a servo unit configured to position said substrate holder;
    a sensor unit configured to determine a distance of at least one location point on the surface of said substrate relative to a reference plane;
    a memory unit configured to store surface information of said substrate based on respective distances of corresponding location points on said substrate surface; and
    a calculating unit configured to determine a feed-forward set-point signal based on said stored surface information, wherein said feed-forward set-point signal is forwardly fed to said servo unit in order to position said substrate holder.

12. The lithographic substrate focus control system of claim 11, wherein said sensor unit includes a level sensor for measuring said surface information of said substrate.

13. The lithographic substrate focus control system of claim 11, wherein said stored surface information of said substrate is formatted as an array of measured distances as a function of two dimensional coordinates, wherein each of said two-dimensional co-ordinates is defined by an orthogonal projection of said corresponding location point on the reference plane.

14. The lithographic substrate focus control system of claim 11, wherein said substrate holder is provided with a substantially flat supporting surface for supporting said substrate and wherein the reference plane is substantially parallel oriented to the supporting surface.

15. The lithographic substrate focus control system of claim 11, wherein the reference plane has a fixed position with respect to a projection system that projects a patterned beam of radiation onto said substrate, and wherein the distances of said substrate surface are determined with respect to said projection system.

16. The lithographic substrate focus control system of claim 11, wherein said calculating unit is configured to fit a mathematical smooth function to said substrate surface based on said surface information and to calculate said feed-forward set-point signal based on said fitted function.

17. The lithographic substrate focus control system of claim 16, wherein said mathematical function comprises at least one polynomial function that is fit locally to said substrate surface.

18. The lithographic substrate focus control system of claim 16, wherein said calculating unit is configured to calculate derivatives of said mathematical smooth function for calculating and incorporating at least one of a speed signal and force signal in said feed-forward set-point signal.

19. The lithographic substrate focus control system of claim 11, wherein said substrate support comprises a second substrate holder and wherein surface information of said second substrate is determined while projecting a patterned beam of radiation onto a target portion of said substrate surface placed on said substrate holder arranged to be positioned by said servo unit based on previously determined surface information of said substrate.

* * * * *